(12) United States Patent
Lu et al.

(10) Patent No.: US 12,278,220 B2
(45) Date of Patent: Apr. 15, 2025

(54) DRIVING SUBSTRATE, LIGHT-EMITTING APPARATUS AND MANUFACTURING METHOD THEREOF, AND SPLICING DISPLAY APPARATUS EACH HAVING DRIVING SUBSTRATE IN BENDING AREA

(71) Applicant: BOE TECHNOLOGY GROUP CO., LTD., Beijing (CN)

(72) Inventors: Xinhong Lu, Beijing (CN); Xiaoyan Zhu, Beijing (CN); Chao Liu, Beijing (CN); Shuilang Dong, Beijing (CN); Jiushi Wang, Beijing (CN); Liuqing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/769,825

(22) PCT Filed: Jun. 25, 2021

(86) PCT No.: PCT/CN2021/102512
§ 371 (c)(1),
(2) Date: Apr. 18, 2022

(87) PCT Pub. No.: WO2022/267044
PCT Pub. Date: Dec. 29, 2022

(65) Prior Publication Data
US 2024/0136336 A1 Apr. 25, 2024
US 2024/0234381 A9 Jul. 11, 2024

(51) Int. Cl.
*H01L 25/075* (2006.01)
*H01L 25/16* (2023.01)
*H01L 33/62* (2010.01)

(52) U.S. Cl.
CPC ........ *H01L 25/0753* (2013.01); *H01L 25/167* (2013.01); *H01L 33/62* (2013.01); *H01L 2933/0066* (2013.01)

(58) Field of Classification Search
CPC .... H01L 25/0753; H01L 25/167; H01L 33/62
See application file for complete search history.

(56) References Cited

U.S. PATENT DOCUMENTS

2007/0273631 A1 11/2007 Su et al.
2017/0262109 A1* 9/2017 Choi .................. G06F 3/04164
(Continued)

FOREIGN PATENT DOCUMENTS

CN 110164901 A 8/2019
CN 110503898 A 11/2019
(Continued)

*Primary Examiner* — Michael Jung
(74) *Attorney, Agent, or Firm* — WHDA, LLP

(57) ABSTRACT

A driving substrate, a light-emitting apparatus and a manufacturing method thereof, a splicing display apparatus, the driving substrate includes: a device disposing area, a bending area and a bonding area, the bending area is located between the device disposing area and the bonding area; the driving substrates located in the device disposing area, the bending area, and the bonding area include a buffer layer, a first conductive layer and a flexible dielectric layer that are stacked in sequence; the driving substrates located in the device disposing area and the bonding area further include a base plate disposed at a side of the buffer layer away from the first conductive layer, and a second conductive layer disposed at a side of the flexible dielectric layer away from the first conductive layer; and the driving substrate located in the bending area is configured to be able to bend along a bending axis.

19 Claims, 7 Drawing Sheets

(56) References Cited

U.S. PATENT DOCUMENTS

| | | | | |
|---|---|---|---|---|
| 2018/0350893 A1* | 12/2018 | Odaka | ............... | H10K 59/131 |
| 2019/0324567 A1* | 10/2019 | Hong | ............... | G06F 3/0446 |
| 2020/0144353 A1* | 5/2020 | Ohara | ............... | G09F 9/30 |
| 2020/0243782 A1 | 7/2020 | Maruyama | | |
| 2020/0303490 A1* | 9/2020 | Tomioka | ............... | G02F 1/1345 |
| 2021/0296394 A1 | 9/2021 | Meng et al. | | |
| 2021/0384314 A1 | 12/2021 | Yamazaki et al. | | |
| 2022/0020823 A1* | 1/2022 | Kim | ............... | H10K 71/00 |
| 2022/0102468 A1* | 3/2022 | Lee | ............... | H10K 77/111 |

FOREIGN PATENT DOCUMENTS

| | | |
|---|---|---|
| CN | 110993568 A | 4/2020 |
| WO | 2020/089762 A1 | 5/2020 |

\* cited by examiner

DRIVING SUBSTRATE, LIGHT-EMITTING APPARATUS AND MANUFACTURING METHOD THEREOF, AND SPLICING DISPLAY APPARATUS EACH HAVING DRIVING SUBSTRATE IN BENDING AREA

TECHNICAL FIELD

The present disclosure relates to the technical field of display, and more particularly, to a driving substrate, a light-emitting apparatus and a manufacturing method thereof, and a splicing display apparatus.

BACKGROUND

With the rapid development of the display technology, Mini LED (Mini Light Emitting Diode, sub-millimeter light-emitting diode) and Micro LED (micro light-emitting diode) display products have attracted widespread attention. One of the advantages of the Micro/mini-LED display products is that they may realize large-area splicing, that is, splicing with multiple driving substrates to obtain super-large-sized display products.

SUMMARY

The present disclosure provides a driving substrate, a light-emitting apparatus and a manufacturing method thereof, and a splicing display apparatus, the frame of the light-emitting apparatus prepared by the driving substrate is relatively narrow, and the display effect is well.

The embodiments of the present disclosure use the following technical solutions:

in one aspect, a driving substrate is provided, including:
a device disposing area, a bending area, and a bonding area, the bending area is located between the device disposing area and the bonding area;
the driving substrates located in the device disposing area, the bending area, and the bonding area includes a buffer layer, a first conductive layer and a flexible dielectric layer that are stacked in sequence;
the driving substrates located in the device disposing area and the bonding area further include a base plate disposed at a side of the buffer layer away from the first conductive layer, and a second conductive layer disposed at a side of the flexible dielectric layer away from the first conductive layer; and
the driving substrate located in the bending area is configured to be capable to bend along a bending axis.

Optionally, the driving substrate further includes a first passivation layer, the first passivation layer covers the flexible dielectric layer located in the device disposing area and the bonding area.

Optionally, the driving substrate further includes a second passivation layer, the second passivation layer covers the second conductive layer, and an orthographic projection of the second passivation layer on the buffer layer does not overlap with an orthographic projection of the flexible dielectric layer located in the bending area on the buffer layer.

Optionally, the driving substrate further includes an organic layer, the organic layer covers the second passivation layer, and an orthographic projection of the organic layer on the buffer layer does not overlap with the orthographic projection of the flexible dielectric layer located in the bending area on the buffer layer.

Optionally, the driving substrate further includes an organic layer, the organic layer covers the second passivation layer, and covers the flexible dielectric layer located in the bending area.

Optionally, when the bending area is in a non-bending state, a surface of the base plate located in the device disposing area away from the flexible dielectric layer and a surface of the base plate located in the bonding area away from the flexible dielectric layer are in a same plane; and
when the bending area is in a bent state, the surface of the base plate located in the bonding area away from the flexible dielectric layer is fixed with the surface of the base plate located in the device disposing area away from the flexible dielectric layer.

Optionally, when the bending area is in a bent state, an adhesive layer is disposed between the surface of the base plate located in the bonding area away from the flexible dielectric layer and the surface of the base plate located in the device disposing area away from the flexible dielectric layer, and the adhesive layer extends to a surface of the buffer layer located in the bending area away from the flexible dielectric layer.

Optionally, a material of the flexible dielectric layer includes a polyimide.

Optionally, a thickness range of the flexible dielectric layer is 3 μm-6 μm.

Optionally, the driving substrate further includes a sacrificial layer and a third passivation layer, the sacrificial layer is located between the base plate and the buffer layer, and the third passivation layer is located between the first conductive layer and the flexible dielectric layer.

Optionally, the first conductive layer includes a first connecting electrode and a second connecting electrode, an orthographic projection of the first connecting electrode on the buffer layer partially overlaps with an orthographic projection of the second conductive layer located in the device disposing area on the buffer layer; the second connecting electrode is located in the bending area, and two ends of the second connecting electrode extend to the device disposing area and the bonding area, respectively.

Optionally, the second conductive layer includes a third connecting electrode, a fourth connecting electrode, and a fifth connecting electrode; the third connecting electrode and the fourth connecting electrode are located in the device disposing area, and the fifth connecting electrode is located in the bonding area;
wherein the third connecting electrode and the first connecting electrode are electrically connected, the fifth connecting electrode and the second connecting electrode are electrically connected.

Optionally, the flexible dielectric layer has a first via hole and a second via hole in a direction perpendicular to the base plate, the first via hole exposes a partial area of the first connecting electrode, and the second via hole exposes a partial area of an end of the second connecting electrode located in the bonding area;
wherein the third connecting electrode is electrically connected to the first connecting electrode through the first via hole, and the fifth connecting electrode is electrically connected to the second connecting electrode through the second via hole.

In another aspect, the present disclosure further provides a light-emitting apparatus, and the apparatus includes: a light-emitting element, a circuit board, and the above-mentioned driving substrate, the light-emitting element is electrically connected to the third connecting electrode and the fourth connecting electrode located in the device disposing area, and the circuit board is electrically connected to the fifth connecting electrode located in the bonding area.

Optionally, the light-emitting apparatus further includes a protective layer disposed at a side of the light-emitting element away from the base plate, and the protective layer covers each of the light-emitting elements and areas between two adjacent light-emitting elements.

In another aspect, the present disclosure further provides a splicing display apparatus, including: a multiport transponder, at least one power supply equipment, a first frame, a second frame, and at least two above-mentioned light-emitting apparatuses;
- wherein light-emitting surfaces of the at least two light-emitting apparatuses are all in a same plane, and each of the light-emitting apparatuses is fixed with the first frame, the first frame is fixed with the second frame, the second frame is located at a side of the first frame away from the light-emitting apparatus, and the multiport transponder and the at least one power supply equipment are fixed with the second frame;
- wherein the multiport transponder and the power supply equipment are electrically connected, the circuit board of each of the light-emitting apparatuses and the multiport transponder are electrically connected.

In another aspect, the present disclosure further provides a manufacturing method of a light-emitting apparatus, and the method includes:
- providing a base plate; wherein the base plate is divided into a device disposing area, a bending area and a bonding area, and the bending area is located between the device disposing area and the bonding area;
- forming a buffer layer;
- forming a first conductive layer; wherein the buffer layer is located between the base plate and the first conductive layer;
- forming a flexible dielectric layer; wherein the flexible dielectric layer is located at a side of the first conductive layer away from the base plate;
- forming a second conductive layer; wherein the second conductive layer is located at a side of the flexible dielectric layer away from the base plate, and an orthographic projection area of the second conductive layer on the base plate does not overlap with an orthographic projection of the flexible dielectric layer located in the bending area on the base plate; and
- removing the base plate located in the bending area.

Optionally, after forming the flexible dielectric layer and before forming the second conductive layer, the method further includes:
- forming a first passivation layer on the flexible dielectric layers located in the device disposing area and the bonding area.

Optionally, after forming the second conductive layer and before removing the base plate located in the bending area, the method further includes:
- forming a second passivation layer on the second conductive layer; wherein the second passivation layer covers the second conductive layer, and an orthographic projection of the second passivation layer on the buffer layer does not overlap with an orthographic projection of the flexible dielectric layer located in the bending area on the buffer layer; and
- forming an organic layer on the second passivation layer; wherein the organic layer at least covers the second passivation layer.

Optionally, forming the organic layer on the second passivation layer, wherein the organic layer at least covers the second passivation layer includes:
- forming an organic thin-film on the second passivation layer;
- patterning the organic thin-film, to obtain the organic layer;
- wherein the organic layer covers the second passivation layer, and an orthographic projection of the organic layer on the buffer layer does not overlap with the orthographic projection of the flexible dielectric layer located in the bending area on the buffer layer; or, the organic layer covers the second passivation layer, and covers the flexible dielectric layer located in the bending area.

Optionally, after removing the base plate located in the bending area, the method further includes:
- forming a water-resistant layer;
- wherein, if the organic layer covers the second passivation layer, and the orthographic projection of the organic layer on the buffer layer does not overlap with the orthographic projection of the flexible dielectric layer located in the bending area on the buffer layer, the water-resistant layer covers the flexible dielectric layer located in the bending area, and covers a side of the organic layer close to the bending area; and
- if the organic layer covers the second passivation layer, and covers the flexible dielectric layer located in the bending area, the water-resistant layer covers the organic layer.

Optionally, forming the first conductive layer includes:
- forming a first connecting electrode and a second connecting electrode at the same time;
- forming the second conductive layer includes:
- forming a third connecting electrode, a fourth connecting electrode and a fifth connecting electrode at the same time; wherein the third connecting electrode and the first connecting electrode are electrically connected, the fifth connecting electrode and the second connecting electrode are electrically connected.

Optionally, after forming the second conductive layer and before removing the base plate located in the bending area, the method further includes:
- electrically connecting a light-emitting element to the third connecting electrode and the fourth connecting electrode; wherein the light-emitting element is located in the device disposing area; and
- electrically connecting a circuit board to a fifth connecting electrode; wherein the circuit board is located in the bonding area.

Optionally, after electrically connecting the circuit board to the fifth connecting electrode, and before removing the base plate located in the bending area, the method further includes:
- forming a protective layer on the light-emitting element; wherein the protective layer covers each of the light-emitting elements and areas between two adjacent light-emitting elements Optionally, after removing the base plate located in the bending area, the method further includes:
- forming adhesive layers on a surface of the base plate located in the bonding area away from the flexible dielectric layer, a surface of the base plate located in the device disposing area away from the flexible dielectric layer, a surface of the buffer layer located in the bending area away from the flexible dielectric layer, and a side of the base plate that is parallel to a direction perpendicular to the flexible dielectric layer and close to the bending area; and bending the bending area, to make the surface of the base plate located in the bonding area away from the flexible dielectric layer to be fixed with the surface of the base plate located in the device disposing area away from the flexible dielectric layer.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art may be briefly introduced below. Apparently, the figures that are described below are embodiments of the present disclosure, and a person skilled in the art may obtain other figures according to these figures without paying creative work.

DETAILED DESCRIPTION OF THE EMBODIMENTS

In order to make the technical solutions of the embodiments of the present disclosure clearer, the embodiments of the present disclosure may be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall in the protection scope of the present disclosure.

In the embodiments of the present disclosure, words such as "first", "second", "third", and "fourth", are used to distinguish the same items or similar items with basically the same functions and effects, which are only for the purpose of clearly describing the technical solutions of the embodiments of the present disclosure, and should not be understood to indicate or imply relative importance or to imply the quantity of technical features indicated. In addition, "plurality" means two or more, unless otherwise expressly and specifically limited.

Micro/mini-LED technology transfers micron-scale Micro/mini-LED to a driving substrate through a mass transfer technology, thereby forming Micro/mini-LED display devices with different sizes. A major advantage of Micro/mini-LED display devices is that they are capable to be spliced, that is, a certain number of small-sized display devices may be used to realize super-large-sized display. However, eliminating seams always becomes a major problem in the splicing process, and for this reason, display products with narrow frames are the focus of attention.

Figure 1A:
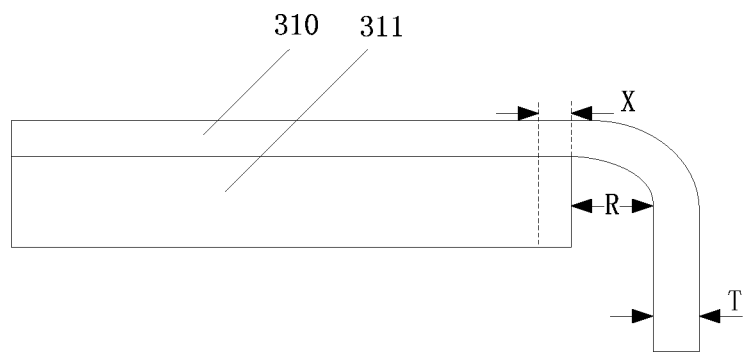
FIG. 1a schematically illustrates a structural schematic diagram of a frame of a light-emitting apparatus in the related art.
Figure 1B:
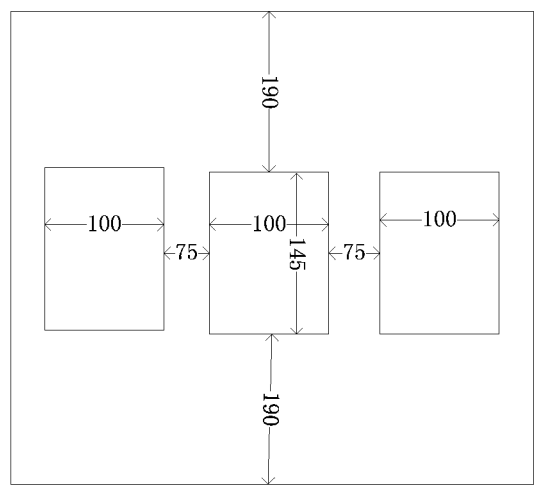
FIG. 1b schematically illustrates a schematic diagram of a pixel size calculation in the related art.

Referring to FIG. 1a, the single-side frame of the display device is mainly composed of three parts: the first part is a cutting tolerance X generated when cutting the glass base plate 310 in the bending area, the second part is a thickness T of each film layer in the bending area, and the third part is the bending margin R generated by bending each film layer, that is, a width of the single-sided frame=X+T+R. The cutting tolerance X is determined by the cutting process, the thickness T of each film layer in the bending area is determined by the film layer design, and the bending margin R is determined by the flexibility of each film layer in the bending area. For the current driving substrate, its cutting tolerance is X=10 μm, the bending margin is R=50 μm, and the thickness of each film layer in the bending area is T=14 μm. In addition, taking the structure shown in FIG. 2 as an example, after the driving substrate in the bending area is bent, a protective glue needs to be filled between the base plate 101 of the bonding area D3 and the base plate 101 of the device disposing area D1 for fixing. Usually, the filling thickness of the protective glue has an error of 10 μm. Therefore, the width of the single-sided frame of the current driving substrate=10 μm*2+50 μm+14 μm+10 μm=94 μm. If two display devices are spliced, the seam between the two display devices should be at least 94*2=188 μm; at this time, if the size of the pixel pitch of the Micro/mini-LED display device does not match the size of the seam, the display effect may be seriously reduced; at present, a single-color Mini LED with a chip size of 100 μm*145 μm as shown in FIG. 1b is selected, and the pixels formed by the die-bonding process with a chip pitch of 75 μm/190 μm are used to match the current level of seam width, that is, the size of the pixel unit is 0.525*0.525 mm. That is to say, if the size of the pixel unit needs to be further reduced and the resolution needs to be improved, a smaller seam width is required to match, so as to improve the display effect.

Figure 2:
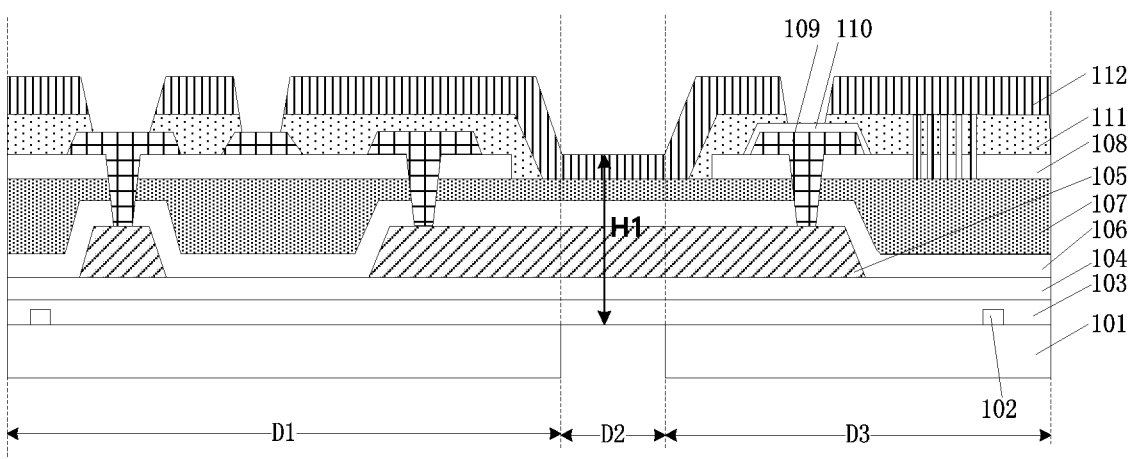
FIG. 2 schematically illustrates a structural schematic diagram of a driving substrate in the related art.

According to the above calculation method of the width of the single-side frame, in order to reduce the width of the single-side frame, the thickness T and the bending margin R of each film layer may be reduced by changing the structural design. In the related art, the width of the single-side frame is reduced by two driving substrates as shown in FIG. 1 and FIG. 2, which are specifically introduced as follows:

Referring to FIG. 2, the first type of the driving substrate in the related art includes a device disposing area D1, a bonding area D3, and a bending area D2 located between the device disposing area D1 and the bonding area D3; the driving substrate located in the bending area D2 includes a flexible base plate 103, a buffer layer 104, a first conductive layer 105, a first passivation layer 106, a first organic layer 107 and a second organic layer 112 that are stacked in sequence;

the driving substrates located in the device disposing area D1 and the bonding area D3 include a rigid base plate 101, an alignment mark of a photomask 102, a flexible base plate 103, a buffer layer 104, a first conductive layer 105, a first passivation layer 106, a first organic layer 107, a second passivation layer 108, a second conductive layer 109, an ITO layer 110, a third passivation layer 111 and a second organic layer 112 that are stacked in sequence.

Figure 3:
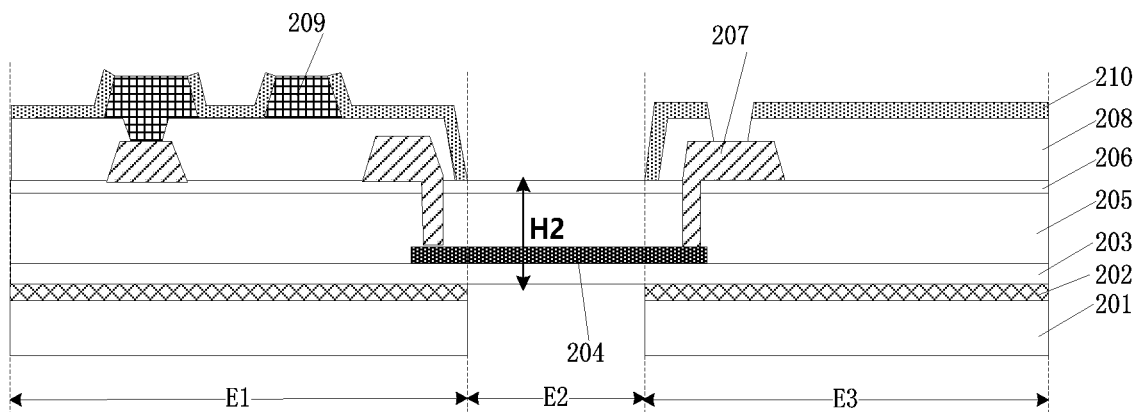
FIG. 3 schematically illustrates a structural schematic diagram of another driving substrate in the related art.

Referring to FIG. 3, the second type of the driving substrate in the related art includes a device disposing area E1, a bonding area E3, and a bending area E2 located between the device disposing area E1 and the bonding area E3; the driving substrates located in the device disposing area E1 and the bonding area E3 include a rigid base plate 201, a sacrificial layer 202, a first buffer layer 203, an overlap electrode layer 204, a flexible organic material layer 205, a second buffer layer 206, a first conductive layer 207, a flat layer 208, a first conductive layer 209 and a third buffer layer 210 that are stacked in sequence; the driving substrate located in the bending area E2 includes a first buffer layer 203, an overlap electrode layer 204, a flexible organic material layer 205 and a second buffer layer 206 that are stacked in sequence.

TABLE 1 strain simulation values of each film layer in the bending area of the driving substrate in the related art

| related art | the first type of the drive substrate | the second type of the drive substrate |
| --- | --- | --- |
| film layers in the bending area | Resin2<br>Resin1<br>SiN<br>Cu<br>SiN<br>PI | SiN<br>PI<br>Cu<br>SiN |
| total thickness of the film layers in the bending area | H1 = 12.7 um | H2 = 6.9 um |
| inorganic layer strain | tensile strain 3.4% | tensile strain 2.5% |
| metal layer strain | tensile strain 3.1% | compressive strain |
| organic layer strain on the side away from the base plate | tensile strain 10.6% | / |

Wherein, the specific conditions of each film layer in the bending area of the first type of the driving substrate in the related art are as follows:

The material of the flexible base plate 103 is polyimide with a thickness of 6.0 μm; the material of the buffer layer 104 is SiNx with a thickness of 0.1 μm; the material of the first conductive layer 105 is copper with a thickness of 2 μm; the material of the first passivation layer 106 is SiNx with a thickness of 0.1 μm; the materials of the first organic layer 107 and the second organic layer 112 are resins, and the total thickness of the materials of the first organic layer 107 and the second organic layer 112 is 4.5 μm.

The specific conditions of each film layer in the bending area of the second type of the driving substrate in the related art are as follows:

The material of the first buffer layer 203 is SiNx with a thickness of 0.1 μm; the material of the overlap electrode layer 204 is copper with a thickness of 0.7 μm; the material of the flexible organic material layer 205 is polyimide with a thickness of 6.0 μm; the material of the second buffer layer 206 is SiNx with a thickness of 0.1 μm.

However, according to the strain data of each film layer in Table 1, it may be seen that each film layer in the bending area of the two driving substrates in the related art still has different degrees of tensile strain, which may cause cracks or even failure of the corresponding film layer, thereby reducing the service life of the driving substrate. It should be noted that the compressive strain in Table 1 is in the allowable strain range of the driving substrate.

$$\sigma \propto \varepsilon \qquad \text{formula (1)}$$

$$\sigma = E * y/R \qquad \text{formula (2)}$$

In addition, according to the calculation formulas of bending strain, in formula (1), the strain & is proportional to the stress σ; in formula (2), the stress σ is equal to the Young's modulus E of the material multiplied by a half y of the total film thickness of the bending area and divided by the bending margin R. When the bending margin R decreases, the strain of the outer inorganic layers of the two driving substrates in the related art in Table 1 may inevitably increase further, thereby accelerating the failure of each film layer.

Figure 4:
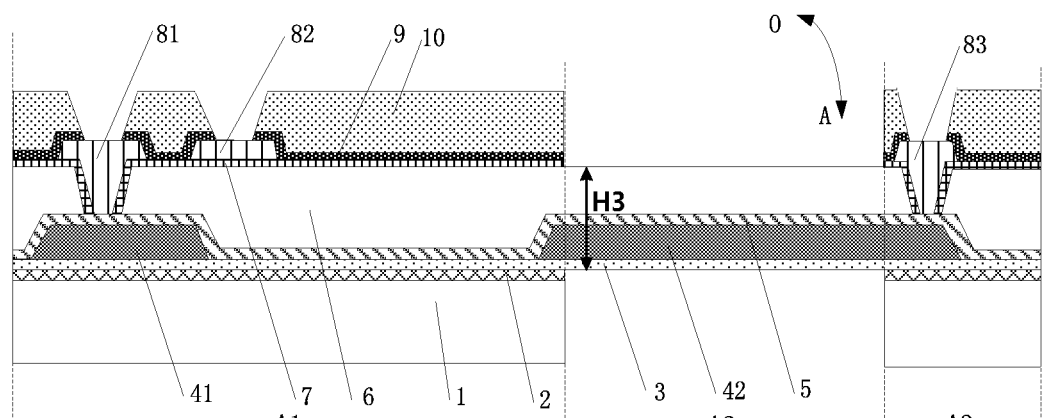
FIG. 4 schematically illustrates a structural schematic diagram of a driving substrate according to the present disclosure.

Based on that, the present disclosure provides a driving substrate, referring to FIG. 4, including: a device disposing area A1, a bending area A2, and a bonding area A3. The bending area A2 is located between the device disposing area A1 and the bonding area A3; the driving substrates located in the device disposing area A1, the bending area A2, and the bonding area A3 include a buffer layer 3, a first conductive layer and a flexible dielectric layer 6 that are stacked in sequence;

wherein the driving substrates located in the device disposing area A1 and the bonding area A3 further include a base plate 1 disposed at a side of the buffer layer 3 away from the first conductive layer, and a second conductive layer disposed at a side of the flexible dielectric layer 6 away from the first conductive layer; and the driving substrate located in the bending area A2 is configured to be capable to bend along a bending axis.

The above-mentioned device disposing area A1 refers to the area used to set the light-emitting element, and the above-mentioned bonding area A3 refers to the area used to bond the circuit board. After setting the light-emitting element and the circuit board on the driving substrate, a light-emitting apparatus is formed.

The above-mentioned base plate 1 may be a flexible base plate, or may also be a rigid base plate. The embodiment of the present application is described by taking the base plate 1 of being the rigid base plate as an example. Specifically, the rigid base plate is a glass.

The specific material of the above buffer layer 3 is not limited here. For example, the material of the buffer layer 3 may be an organic material, or may also be an inorganic material.

In the embodiment provided in the present disclosure, the material of the above buffer layer 3 is silicon nitride, silicon oxide or silicon oxynitride, and its thickness range is 500 A-1000 A, which is used to prevent water vapor from entering the interior of the driving substrate; the materials of the above first conductive layer and the above second conductive layer are all at least one of copper, molybdenum, titanium or aluminum. For example, the materials of the first conductive layer and the second conductive layer are both copper, and their thickness ranges are both 1 μm-2 μm; the material of the flexible dielectric layer 6 is polyimide (PI), its thickness range is 3 μm-6 μm. Since polyimide material is insulating and flexible to a certain extent, the flexible dielectric layer 6 is used as the dielectric layer of the first conductive layer and the second conductive layer on the one hand, and used as the support layer of each film layer in the bending layer on the other hand.

It should be noted that the above bending axis is not an actual structure existing in the driving substrate, but is only a concept proposed to illustrate the bending process of the driving substrate.

In addition, the bending direction of the above-mentioned driving substrate is not limited here neither. For example, the bending direction may be the OA direction as shown in FIG. 4, or may be the AO direction. The specific bending direction may be determined according to the actual situation. The examples provided in the present disclosure are described by taking the above-mentioned driving substrate bending along the OA direction as an example.

In the embodiment provided in the present disclosure, since the driving substrate located in the bending area A2 includes the buffer layer 3, the first conductive layer and the flexible dielectric layer 6, when the driving substrate located in the bending area A2 is bent along the bending axis, the total thickness of various film layers in the bending area A2 is smaller and the flexibility of each film layer is better, which may greatly reduce the bending margin R, thereby reducing the width of the single-side frame; in addition, the bending stress of the buffer layer 3, the first conductive layer and the flexible dielectric layer 6 is small, which may also improve the failure problem of each film layer caused by bending stress during bending.

Referring to FIG. 4, the driving substrate further includes a first passivation layer 7, the first passivation layer 7 covers the flexible dielectric layer 6 located in the device disposing area A1 and the bonding area A3.

Referring to FIG. 4, the driving substrate further includes a second passivation layer 9, the second passivation layer 9 covers the second conductive layer, and an orthographic projection of the second passivation layer 9 on the buffer layer 3 does not overlap with an orthographic projection of the flexible dielectric layer 6 located in the bending area A2 on the buffer layer 3.

Since the above-mentioned flexible dielectric layer 6 is usually made of an organic material, the water and oxygen barrier effect of the organic material is low. By setting the first passivation layer 7 between the flexible dielectric layer 6 and the second conductive layer, and setting the second passivation layer 9 on the second conductive layer, since both the first passivation layer 7 and the second passivation layer 9 are made of inorganic materials, the effect of blocking water and oxygen on the driving substrate may be greatly improved. Further, in order not to increase the total film thickness in the bending area of the driving substrate, the first passivation layer 7 only covers the flexible dielectric layer 6 located in the device disposing area A1 and the bonding area A3, but does not cover the flexible dielectric layer 6 located in the bending area A2; and the second passivation layer 9 covers the second conductive layer and does not cover the flexible dielectric layer 6 located in the bending area A2.

It should be noted that the above-mentioned second passivation layer 9 not only covers the second conductive layer, but also covers the areas where the second conductive layer is not provided in the device disposing area A1 and the bonding area A3.

Optionally, referring to FIG. 4, the driving substrate further includes an organic layer 10, the organic layer 10 covers the second passivation layer 9, and the orthographic projection of the organic layer 10 on the buffer layer 3 and the orthographic projection of the flexible dielectric layer 6 located in the bending area A2 on the buffer layer 3 do not overlap each other.

TABLE 2 strain simulation results of each film layer in the bending area of the driving substrate of the present disclosure:

| the present disclosure | the driving substrate of the present disclosure |
|---|---|
| film layers in the bending area | PI |
|  | SiN |
|  | Cu |
|  | SiN |
| total thickness of the film layers in the bending area | H3 = 5.2 um |
| inorganic layer strain | / |
| metal layer strain | compressive strain |
| organic layer strain | / |

It should also be noted that, the embodiment of the present disclosure takes the material of the buffer layer 3 to be silicon nitride with a thickness of 0.1 μm; the material of the first conductive layer to be copper with a thickness of 2 μm; the material of the third passivation layer 5 to be silicon nitride with a thickness of 0.1 μm; the material of the flexible dielectric layer 6 to be polyimide (PI) with a thickness of 3.0 μm as an example to illustrate. Referring to FIG. 4, the third passivation layer 5 is located between the first conductive layer and the flexible dielectric layer 6. In the embodiment provided in the present disclosure, the thickness range of the flexible dielectric layer is 3 μm to 6 μm.

As shown in Table 2, the film layers in the bending area A2 are the buffer layer SiNx, the first conductive layer Cu, the third passivation layer SiNx and the flexible dielectric layer PI in sequence, at this time, the total thickness of various film layers in the bending area A2 is H3=5.2 μm; and in this case, according to the above formulas for calculating the width of the single-side frame, the single-side frame may be as low as 40 µm. Under this structure, by further adjusting the manufacturing process, the width of the single-side frame may be even smaller.

It should be noted that the compressive strain in Table 2 is in the allowable strain range of the driving substrate. The film layer failure caused by strain in the present disclosure mainly refers to the film layer failure caused by the tensile strain. And the simulation results of the strains in Table 1 and Table 2 are all obtained by simulating and calculating when the driving substrate is bent along the OA direction as shown in FIG. 4.

In the driving substrate shown in FIG. 4, the organic layer 10 located in the bending area A2 is removed, which reduces the total thickness of the film layers of the bending area A2, thereby reducing the bending margin R, which may reduce the width of the single-side frame; in addition, When the driving substrate located in the bending area A2 is bent, the strain of the bending area A2 is reduced, thereby reducing the probability of failure of each film layer in the bending area A2, and prolonging the service life of the driving substrate.

Figure 5:
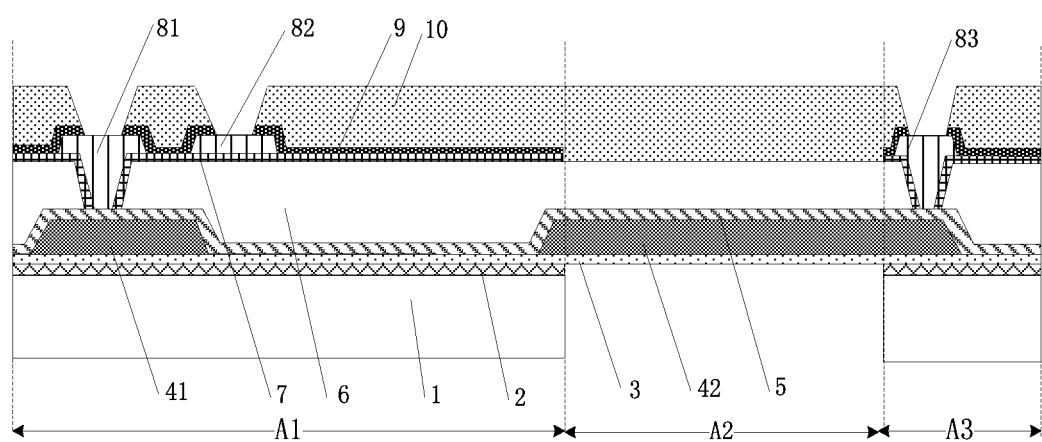
FIG. 5 schematically illustrates a structural schematic diagram of another driving substrate according to the present disclosure.

Referring to FIG. 5, the driving substrate further includes an organic layer 10, the organic layer 10 covers the second passivation layer 9, and covers the flexible dielectric layer 6 located in the bending area A2.

In the driving substrate shown in FIG. 5, the organic layer 10 of the bending area A2 is reserved. In this way, in the process of manufacturing the driving substrate, when the base plate 1 of the bending area A2 is removed, the organic layer 10 of the bending area A2 plays a strong supporting role for the flexible dielectric layer 6 located in the bending area A2, to avoid the damage on the driving substrate when the base plate 1 is peeled off mechanically.

Figure 8:
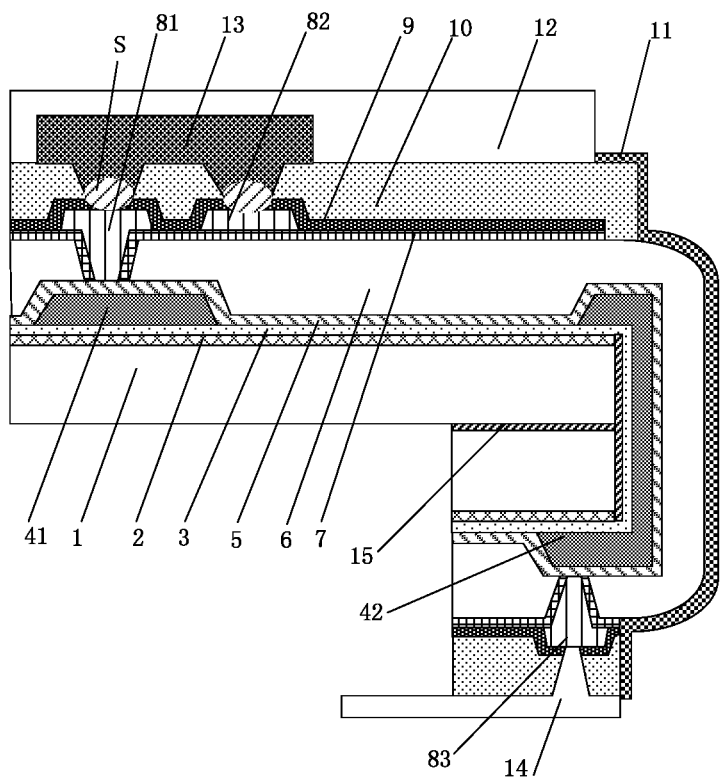
FIG. 8 schematically illustrates a structural schematic diagram of the light-emitting apparatus in FIG. 6 when the bending area is in a bent state.
Figure 9:
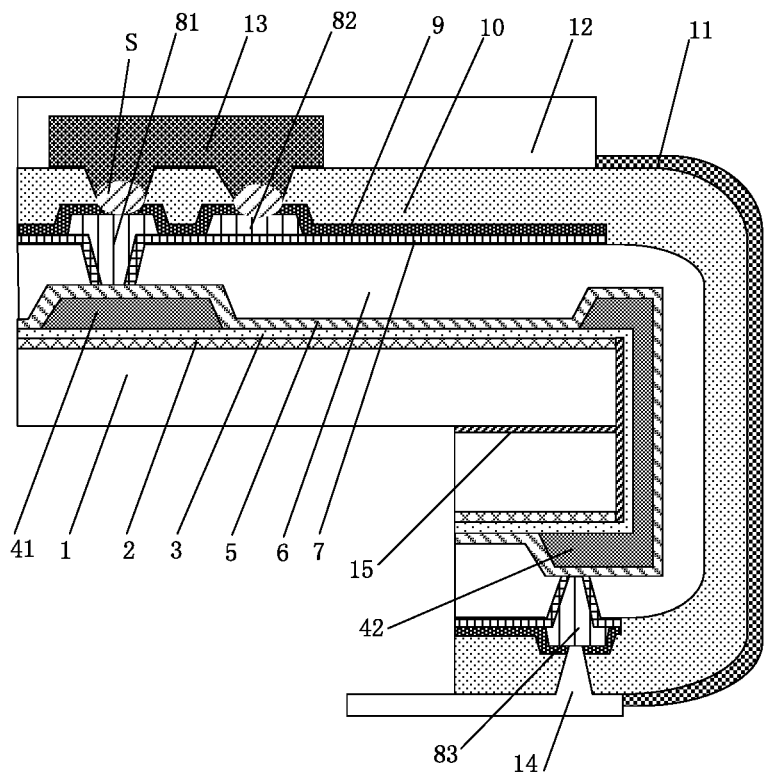
FIG. 9 schematically illustrates a structural schematic diagram of the light-emitting apparatus in FIG. 7 when the bending area is in a bent state.

Optionally, referring to FIG. 4 or FIG. 5, when the bending area A2 is in a non-bending state, a surface of the base plate 1 located in the device disposing area A1 away from the flexible dielectric layer 6 and a surface of the base plate 1 located in the bonding area A3 away from the flexible dielectric layer 6 are in a same plane;

referring to FIG. 8 or FIG. 9, when the bending area A2 is in a bent state, the surface of the base plate 1 located in the bonding area A3 away from the flexible dielectric layer 6 is fixed with the surface of the base plate 1 located in the device disposing area A1 away from the flexible dielectric layer 6.

It should be noted that after the driving substrate located in the bending area is bent along the OA direction as shown in FIG. 4, the surface of the base plate 1 located in the bonding area A3 away from the flexible dielectric layer 6 and the surface of the base plate 1 located in the device disposing area A1 away from the flexible dielectric layer 6 are fixed together. The present disclosure does not draw the driving substrate in the bent state, in order to explain the structure of the bent driving substrate, the bent structure of the light-emitting apparatus composed of the driving substrate shown in FIG. 8 and FIG. 9 may be described.

Optionally, referring to FIG. 8 or FIG. 9, when the bending area A2 is in a bent state, an adhesive layer 15 is disposed between the surface of the base plate 1 located in the bonding area A3 away from the flexible dielectric layer 6 and the surface of the base plate 1 located in the device disposing area A1 away from the flexible dielectric layer 6, and the adhesive layer 15 extends to a surface of the buffer layer 3 located in the bending area A2 away from the flexible dielectric layer 6.

It should be noted that the driving substrate in the bent state is not drawn in the present disclosure. In order to illustrate the specific position of the adhesive layer in the bent driving substrate, the bent structure of the light-emitting apparatus composed of the driving substrate shown in FIG. 8 and FIG. 9 may be described.

The above-mentioned adhesive layer 15 is made of a curing glue, for example, a light curing glue or a heat curing glue. The thickness of the above-mentioned adhesive layer 15 ranges from 5 µm to 15 µm, for example, 5 µm, 8 µm, 10 µm or 15 µm.

In the actual manufacturing process, after removing the base plate 1 of the bending area A2, as shown in FIG. 4, coating one adhesive layer 15 on the surface of the base plate 1 of the bonding area A3 away from the flexible dielectric layer 6, on the surface of the base plate 1 of the device disposing area A1 away from the flexible dielectric layer 6, on the surface of the buffer layer 3 of the bending area A2 away from the flexible dielectric layer 6 and on the side of the base plate 1 that is parallel to the direction perpendicular to the flexible dielectric layer 6 and close to the bending area A2, respectively. And then the driving substrate is bent along the OA direction shown in FIG. 4, to make the surface of the base plate 1 of the bonding area A3 away from the flexible dielectric layer 6 and the surface of the base plate 1 of the device disposing area A1 away from the flexible dielectric layer 6 are fixed together, then light treatment or heat treatment is performed on the driving substrate to cure the adhesive layer 15.

Optionally, referring to FIG. 4, the driving substrate further includes a sacrificial layer 2 and a third passivation layer 5, the sacrificial layer 2 is located between the base plate 1 and the buffer layer 3, and the third passivation layer 5 is located between the first conductive layer and the flexible dielectric layer 6.

The above-mentioned sacrificial layer 2 is also called a DBL layer (De-Bonding Layer, mechanical peeling layer), which is made of polyimide, and its thickness ranges from 300 Å to 1000 Å, such as 300 Å, 500 Å or 800 Å. In the actual production process, when the base plate 1 of the bending area A2 is removed, the sacrificial layer 2 of the bending area A2 and the base plate 1 of the bending area A2 are peeled off at the same time. By setting the sacrificial layer 2, the driving substrate may be protected from damage when the base plate 1 is removed.

The above-mentioned third passivation layer 5 is located between the first conductive layer and the flexible dielectric layer 6, and the third passivation layer 5 covers the first conductive layer. In practical applications, since the flexible dielectric layer 6 (polyimide) is cured at a high temperature, such as 350° C., in order to avoid that the first conductive layer is oxidized at a high temperature, a third passivation layer 5 is disposed between the first conductive layer and the flexible dielectric layer 6 to protect the first conductive layer.

Optionally, referring to FIG. 4 or FIG. 5, the first conductive layer includes a first connecting electrode 41 and a second connecting electrode 42, an orthographic projection of the first connecting electrode 41 on the buffer layer 3 partially overlaps with an orthographic projection of the second conductive layer located in the device disposing area A1 on the buffer layer 3; the second connecting electrode 42 is located in the bending area A2, and two ends of the second connecting electrode 42 extend to the device disposing area A1 and the bonding area A2, respectively;

the second conductive layer includes a third connecting electrode 81, a fourth connecting electrode 82, and a fifth connecting electrode 83; the third connecting electrode 81 and the fourth connecting electrode 82 are located in the device disposing area A1, and the fifth connecting electrode 83 is located in the bonding area A3;

wherein the third connecting electrode 81 and the first connecting electrode 41 are electrically connected, the fifth connecting electrode 83 and the second connecting electrode 42 are electrically connected.

The driving substrate provided by the embodiment of the present disclosure forms a part of the control circuit through the first connecting electrode 41, the third connecting electrode 81 and the fourth connecting electrode 82 set in the device disposing area A1, and is used to provide electrical signals to the light-emitting element to control the opening and closing of the light-emitting element 13; and forms a part of the driving circuit through the second connecting electrode 42 and the fifth connecting electrode 83, and is electrically connected with the control circuit, to provide drive signals to the control circuit.

It should be noted that other structures included in the above-mentioned control circuit and the driving circuit may refer to the related art, which may not be repeated here.

Specifically, referring to FIG. 4 or FIG. 5, the flexible dielectric layer 6 is provided with a first via hole and a second via hole in a direction perpendicular to the base plate 1, the first via hole exposes a partial area of the first connecting electrode 41, and the second via hole exposes a partial area of an end of the second connecting electrode 42 located in the bonding area A3;

wherein the third connecting electrode 81 is electrically connected to the first connecting electrode 41 through the first via hole, and the fifth connecting electrode 83 is electrically connected to the second connecting electrode 42 through the second via hole.

The embodiment of the present disclosure provides a flexible dielectric layer 6 with a first via hole and a second via hole. In practical applications, the third connecting electrode 81 and the first connecting electrode 41 may also be electrically connected through other media or structures, and the fifth connecting electrode 83 and the second connecting electrode 42 may also be electrically connected through other media or structures. For details, reference may be made to the related art, which may not be further described here.

In addition, referring to FIG. 4 or FIG. 5, the organic layer 10 is provided with a third via hole, a fourth via hole and a fifth via hole along the direction perpendicular to the base plate 1, the third via hole exposes a partial area of the third connecting electrode 81, and the fourth via hole exposes a partial area of the fourth connecting electrode 82, the fifth via hole exposes a partial area of the fifth connecting electrode 83.

Certainly, the above driving substrate also includes other film layer structures and components. Only the film layer structures and components related to the invention of the present disclosure are introduced here. For other film layer structures and components included in the above driving substrate, reference may be made to the introduction of the related art, which may not be repeated here.

Figure 6:
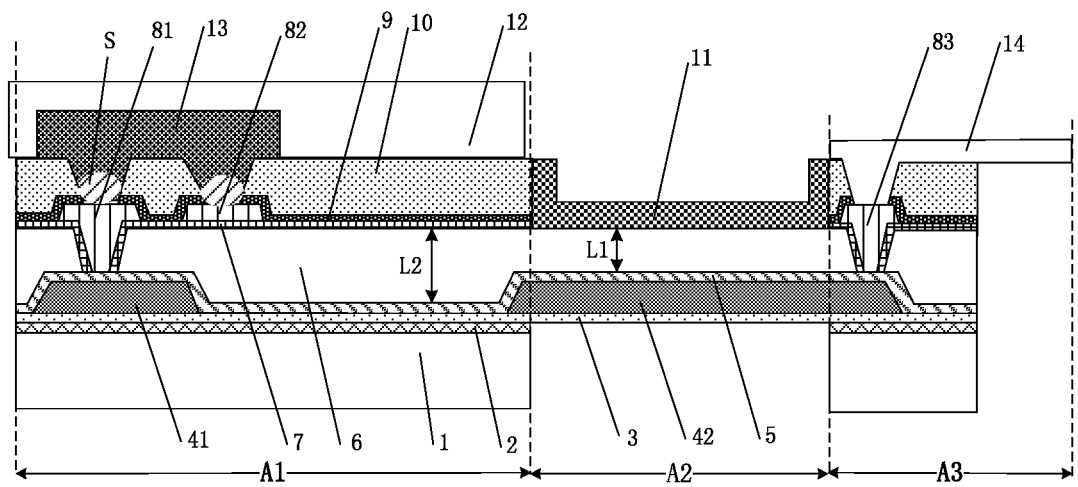
FIG. 6 schematically illustrates a structural schematic diagram of a light-emitting apparatus according to the present disclosure.
Figure 7:
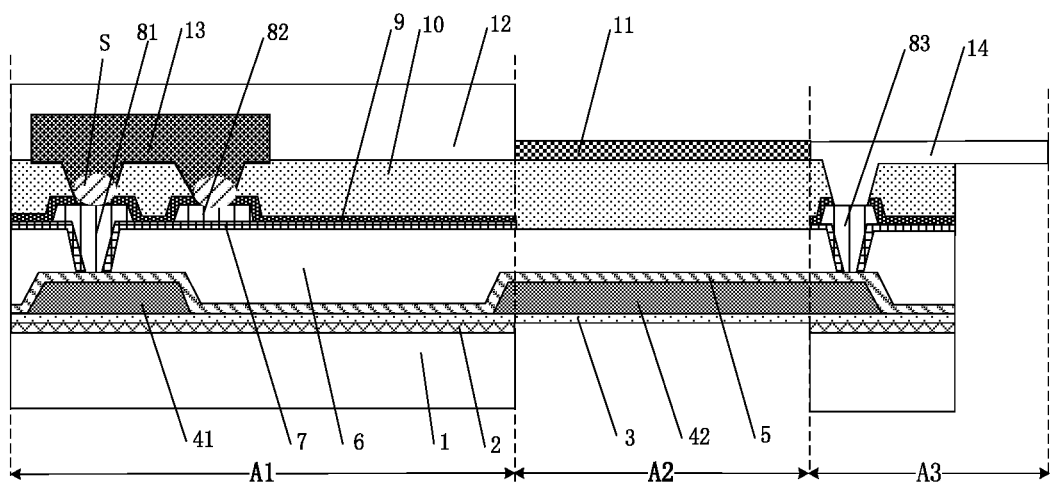
FIG. 7 schematically illustrates a structural schematic diagram of another light-emitting apparatus according to the present disclosure.

In another aspect, the embodiment of the present disclosure provides a light-emitting apparatus, referring to FIG. 6 or FIG. 7, including: a light-emitting element 13, a circuit board 14, and the above-mentioned driving substrate, two pins of the light-emitting element 13 are electrically connected to the third connecting electrode 81 and the fourth connecting electrode 82 of the device disposing area A1 through a soldering material S (such as solder), respectively, and the circuit board 14 is electrically connected to the fifth connecting electrode 83 of the bonding area A3 through an anisotropic conductive glue.

The above-mentioned light-emitting element may be a micro LED, such as: Mini LED or Micro LED. The above-mentioned circuit board may be a flexible circuit board (FPC).

Optionally, referring to FIG. 6 or FIG. 7, the light-emitting apparatus further includes a protective layer 12 disposed at a side of the light-emitting element 13 away from the base plate 1, and the protective layer 12 covers each of the light-emitting elements 13 and areas between two adjacent light-emitting elements 13.

Further, the above-mentioned protective layer may also cover the organic layer located in the device disposing area. In practical applications, the above-mentioned protective layer may include a first sublayer and a second sublayer, wherein the second sublayer is located on a side of the first sublayer away from the light-emitting element, the second sublayer is a white glue or a transparent glue material, and is used to protect the light-emitting element; the first sublayer is a dark color (such as black/dark green/dark blue, etc.) plastic material, which is set between adjacent light-emitting elements to prevent the cross-color of light emitted by various light-emitting elements.

Or, the above-mentioned protective layer may also include only one sublayer, namely, only a black glue, which may cover the light-emitting element and the area between the two adjacent light-emitting elements through the black glue, and plays the role of protecting the light-emitting element and preventing the cross-color at the same time. In this case, the thickness of the black glue covering the light-emitting surface of the light-emitting element should not affect the light-emitting effect of the light-emitting element.

Further, the light-emitting apparatus also includes a water-resistant layer 11.

Referring to FIG. 6, if the organic layer 10 covers the second passivation layer 9, and the orthographic projection of the organic layer 10 on the buffer layer 3 and the orthographic projection of the flexible dielectric layer 6 located in the bending area A2 on the buffer layer 3 do not overlap with each other, the water-resistant layer 11 covers the flexible dielectric layer 6 located in the bending area A2, and covers the side of the organic layer 10 close to the bending area A2;

referring to FIG. 7, if the organic layer 10 covers the second passivation layer 9 and covers the flexible dielectric layer 6 located in the bending area A2, the water-resistant layer 11 covers the organic layer 10 located in the bending area A2.

Since the flexible dielectric layer 6 is usually made of polyimide, its water barrier performance is poor. By covering the flexible dielectric layer 6 located in the bending area A2 with the water-resistant layer 11, to protect the flexible dielectric layer 6 and improve the quality of the driving substrate.

In practical applications, the above-mentioned light-emitting apparatus may be used as a backlight device, or may also be used as a display device, depending on the provided type of light-emitting element 13. Specifically, if a plurality of light-emitting elements 13 in the light-emitting apparatus are light-emitting elements that emit a blue light, the above-mentioned light-emitting apparatus may be used as the backlight device; if the plurality of light-emitting elements 13 in the light-emitting apparatus includes three light-emitting elements that emit a red light, a green light and a blue light, the above-mentioned light-emitting apparatus may be used as the display device.

In the embodiment provided in the present disclosure, since the driving substrate located in the bending area A2 of the light-emitting apparatus includes the buffer layer 3, the first conductive layer and the flexible dielectric layer 6, when the bending area A2 is bent along the bending axis, the total thickness of various film layers in the bending area A2 is small and the flexibility of each film layer is better, which may greatly reduce the bending margin R, thereby reducing the width of the single-side frame; in addition, the bending stress of the buffer layer 3, the first conductive layer and the flexible dielectric layer 6 are all small, which may also improve the failure problem of each film layer caused by bending stress during bending.

Figure 10:
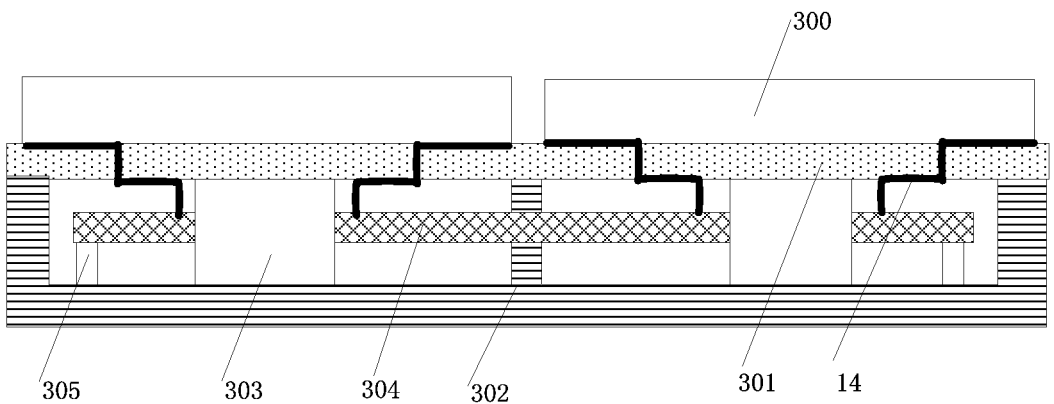
FIG. 10 schematically illustrates a structural schematic diagram of a splicing display apparatus according to the present disclosure.

In another aspect, the embodiment of the present disclosure provides a splicing display apparatus, referring to FIG. 10, including a multiport transponder (Hub) 304, at least one power supply equipment 303, a first frame 301, a second frame 302, and at least two light-emitting apparatuses 300 as described above;

light-emitting surfaces of the at least two light-emitting apparatuses 300 are all in a same plane, and each of the light-emitting apparatuses 300 is fixed with the first frame 301, the first frame 301 is fixed with the second frame 302, the second frame 302 is located at a side of the first frame 301 away from the light-emitting apparatus 300, and the multiport transponder 304 and the at least one power supply equipment 303 are fixed with the second frame 302;

wherein the multiport transponder 301 and the power supply equipment 303 are electrically connected, the circuit board 14 of each of the light-emitting apparatuses 300 and the multiport transponder 302 are electrically connected.

The quantity of the above-mentioned power supply equipment may be in one-to-one correspondence to the quantity of light-emitting apparatuses, or a plurality of light-emitting apparatuses may share one power supply equipment, which may be determined according to the situation.

Figure 11:
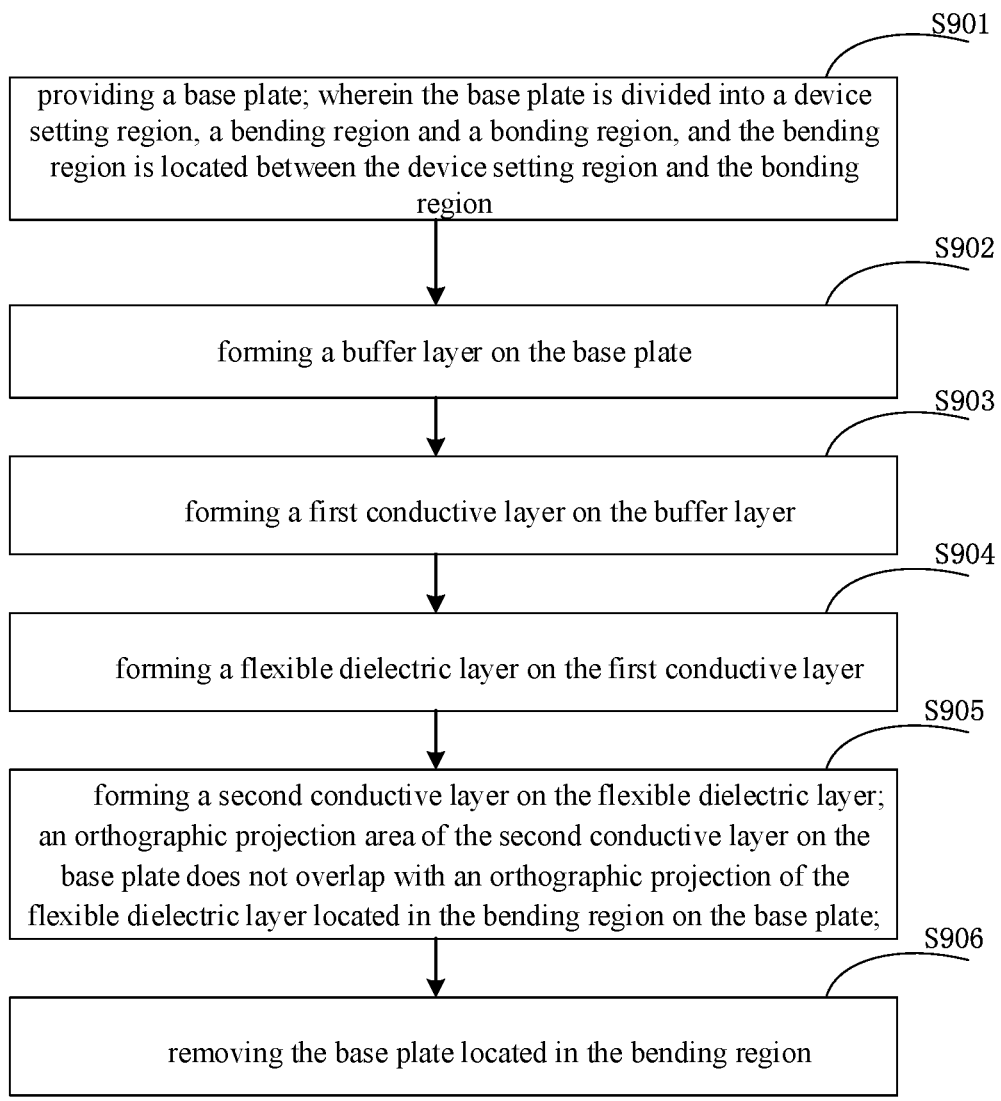
FIG. 11 schematically illustrates a flow chart of a manufacturing method of a light-emitting apparatus according to the present disclosure.
Figure 12:
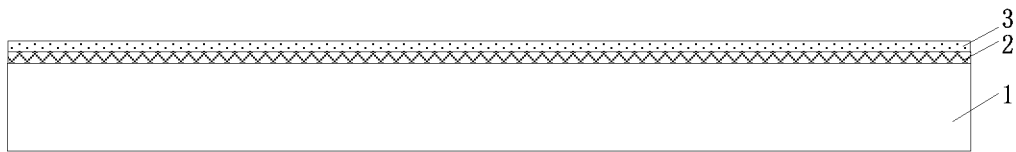
FIGS. 12 to 17 schematically illustrates a structural schematic diagram of an intermediate structure during the preparation of the light-emitting apparatus according to the present disclosure.

In another aspect, the present disclosure further provides a manufacturing method of a light-emitting apparatus, referring to FIG. 11, the method includes:

S901, providing a base plate 1 as shown in FIG. 12; wherein the base plate 1 is divided into a device disposing area A1, a bending area A2 and a bonding area A3, and the bending area A2 is located between the device disposing area A1 and the bonding area A3;

the above-mentioned base plate may be a flexible base plate, or may also be a rigid base plate. The embodiments of the present disclosure are described by taking the above-mentioned base plate to be the rigid base plate as an example. Specifically, the rigid base plate is a glass.

S902, forming a buffer layer 3;

In the embodiment provided in the present disclosure, the material of the buffer layer is silicon nitride, silicon oxide or silicon oxynitride, and its thickness range is 500 A-1000 A, which is used to prevent water vapor from entering the interior of the driving substrate. The above buffer layer is formed by a CVD (chemical vapor deposition) method.

Figure 13:
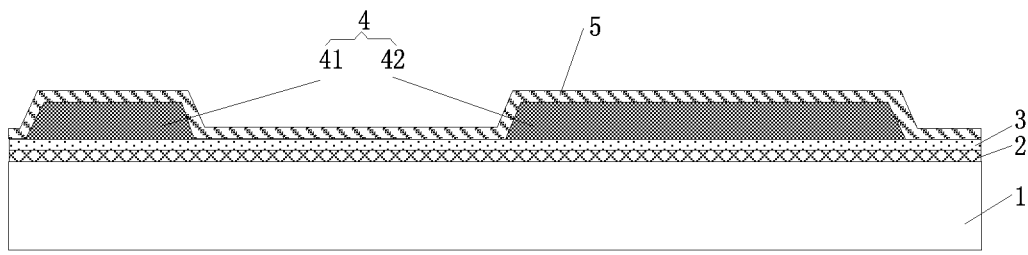
Figure 14:
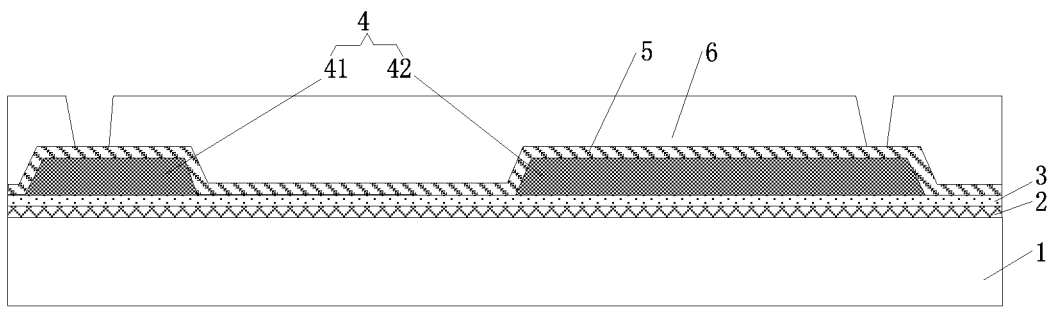

S903, forming a first conductive layer 4 as shown in FIG. 13; wherein the buffer layer 3 is located between the base plate 1 and the first conductive layer 4;

S904, forming a flexible dielectric layer 6 as shown in FIG. 14; wherein the flexible dielectric layer 6 is located at a side of the first conductive layer 4 away from the base plate 1;

the material of the above flexible dielectric layer is polyimide (PI), and its thickness range is 3 µm-6 µm. Since the polyimide material is insulating and flexible to a certain extent, the flexible dielectric layer is used as the dielectric layers of the first conductive layer and the second conductive layer on one hand, and used as a support layer for each film layer in the bending area on the other hand.

Figure 16:
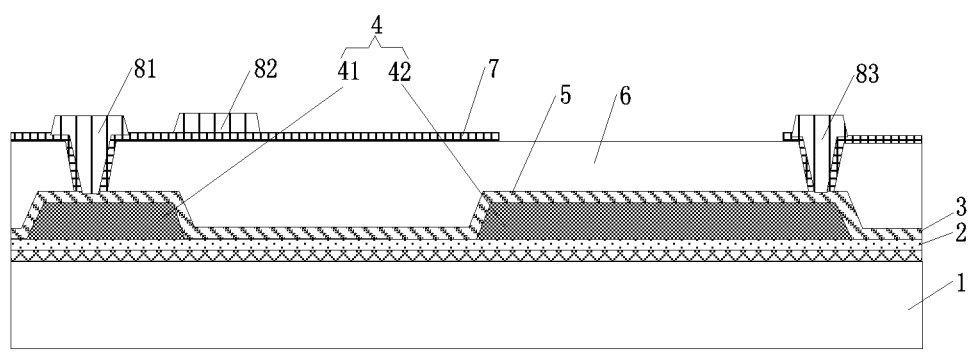

S905, forming a second conductive layer as shown in FIG. 16; wherein the second conductive layer is located at a side of the flexible dielectric layer 6 away from the base plate 1, and an orthographic projection area of the second conductive layer on the base plate 1 does not overlap with an orthographic projection of the flexible dielectric layer 6 located in the bending area A2 on the base plate;

the above-mentioned materials of the first conductive layer and the second conductive layer are at least one of copper, molybdenum, titanium, or aluminum. For example, the materials of the first conductive layer and the second conductive layer are both copper, and their thickness ranges are both 1 µm-2 µm.

S906, removing the base plate 1 located in the bending area A2.

In the light-emitting apparatus manufactured by the manufacturing method provided in the embodiment of the present disclosure, since the bending area of the light-emitting apparatus includes the buffer layer 3, the first conductive layer and the flexible dielectric layer 6, when the driving substrate located in the bending area A2 is bent along the bending axis, the total thickness of each film layer in the bending area A2 is small and the flexibility of each film layer is better, which may greatly reduce the bending margin R, thereby reducing the width of the single-side frame; in addition, the bending stresses of the buffer layer 3, the first conductive layer and the flexible dielectric layer 6 are relatively small, and the problem of failure of each film layer caused by the bending stress during bending may also be improved.

Figure 15:
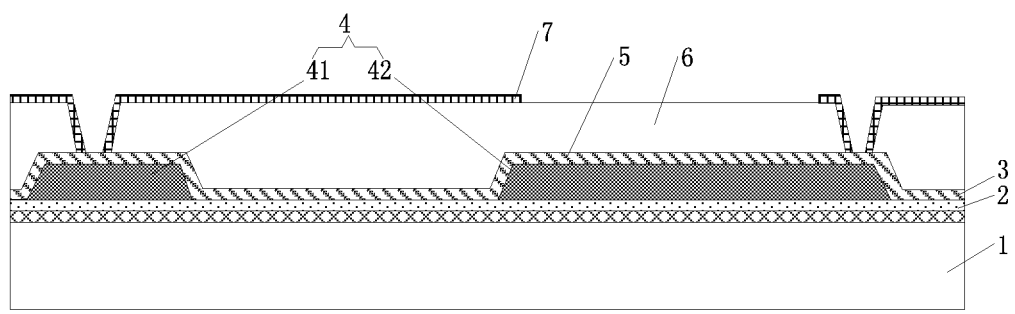

Optionally, after step S904, forming the flexible dielectric layer 6, and before step S905, forming the second conductive layer, the method further includes:

S907, referring to FIG. 15, forming a first passivation layer 7 on the flexible dielectric layers 6 located in the device disposing area A1 and the bonding area A3.

Since the above-mentioned flexible dielectric layer 6 is usually made of an organic material, the water and oxygen barrier effect of the organic material is low. By disposing the first passivation layer 7 between the flexible dielectric layer 6 and the second conductive layer, the water and oxygen barrier effect of the driving substrate may be greatly improved. Further, in order not to increase the total film thickness in the bending area of the driving substrate, the first passivation layer 7 only covers the flexible dielectric layers 6 located in the device disposing area A1 and the bonding area A3, and does not cover the flexible dielectric layer 6 located in the bending area A2.

It should be noted that, when the first passivation layer 7 is formed, a CVD method may be used to form an entire layer of a first passivation layer film, then, by being patterned to form the first passivation layer 7 as shown in FIG. 15; or, the CVD method may be used to form an entire layer of the first passivation layer film, and then in a subsequent process, patterning is performed on the entire layer of the first passivation layer film and the second passivation layer 9 at the same time. For details, the description of forming the second passivation layer is shown as below.

Optionally, after step S905, forming the second conductive layer, and before step S906, removing the base plate located in the bending area, the method further includes:

S908, forming a second passivation layer 9 as shown in FIG. 7 on the second conductive layer; wherein the second passivation layer 9 covers the second conductive layer, and an orthographic projection of the second passivation layer 9 on the buffer layer 3 does not overlap with an orthographic projection of the flexible dielectric layer 6 located in the bending area A2 on the buffer layer 3;

If the first passivation layer 7 is already formed before forming the second passivation layer 9, the specific process of forming the second passivation layer 9 is as follows:

First of all, a CVD method is used to form an entire layer of a second passivation layer film, and the second passivation layer film is patterned to form the second passivation layer 9.

If the first passivation layer film is not patterned before forming the second passivation layer 9, the specific process of forming the first passivation layer 7 and the second passivation layer 9 is as follows:

First of all, a CVD method is used to form an entire layer of a second passivation layer film, and the first passivation layer film and the second passivation layer film are patterned at the same time, and the first passivation layer 7 and the second passivation layer 9 are obtained at the same time.

S909, forming an organic layer 10 on the second passivation layer 9; as shown in FIG. 6, the organic layer 10 at least covers the second passivation layer 9.

Further, step S909, forming an organic layer 10 on the second passivation layer 9, the organic layer 10 at least covers the second passivation layer 9 includes:

S9091, forming an organic thin-film on the second passivation layer 9;

S9092, patterning the organic thin-film, to obtain the organic layer 10;

Wherein, referring to FIG. 6, the organic layer 10 covers the second passivation layer 9, and an orthographic projection of the organic layer 10 on the buffer layer 3 does not overlap with the orthographic projection of the flexible dielectric layer 6 located in the bending area A2 on the buffer layer 3; or, referring to FIG. 7, the organic layer 10 covers the second passivation layer 9, and covers the flexible dielectric layer 6 located in the bending area A2.

It should be noted that when the organic layer 10 is provided with the structure as shown in FIG. 6, there are two manufacturing methods when forming the organic layer 10:

the first method: the organic thin-film may be formed on the second passivation layer 9 first, and then patterned to obtain the organic layer 10 as shown in FIG. 6.

The second method: the organic thin-film may be formed on the second passivation layer 9 first, and then after step S906, removing the base plate 1 located in the bending area A2, patterning is performed on the organic thin-film to form the organic layer 10 as shown in FIG. 6.

The above-mentioned second manufacturing method of the organic layer 10 enables the organic layer 10 to effectively support the driving substrate when peeling off the base plate 1 located in the bending area A2, to avoid the damage to the driving substrate during the peeling process.

Optionally, after step S906, removing the base plate 1 located in the bending area A2, the method further includes:

step S910, forming a water-resistant layer 11 as shown in FIG. 6 or FIG. 7;

wherein, referring to FIG. 6, if the organic layer 10 covers the second passivation layer 9, and the orthographic projection of the organic layer 10 on the buffer layer 3 does not overlap with the orthographic projection of the flexible dielectric layer 6 located in the bending area A2 on the buffer layer 3, the water-resistant layer 11 covers the flexible dielectric layer 6 located in the bending area A2, and covers a side of the organic layer 10 close to the bending area A2;

referring to FIG. 7, if the organic layer 10 covers the second passivation layer 9, and covers the flexible dielectric layer 6 located in the bending area A2, the water-resistant layer 11 covers the organic layer 10 located in the bending area A2.

It should be noted that, in the actual preparation process, the water-resistant layer 11 is formed after the steps of electrically connecting the light-emitting element 13 with the third connecting electrode 81 and the fourth connecting electrode 82; electrically connecting the circuit board 14 with the fifth connecting electrode 83; forming a protective layer 12 on the light-emitting element 13; or, formed after the steps of electrically connecting the light-emitting element 13 with the third connecting electrode 81 and the fourth connecting electrode 82; electrically connecting the circuit board 14 with the fifth connecting electrode 83; then forming the protective layer 12 on the light-emitting element 13; and bending the light-emitting apparatus.

The material of the above-mentioned water-resistant layer 11 is SiNx, and the thickness range is 2000 A-4000 A, and the water-resistant layer 11 is usually obtained by side deposition using a 3D sputter device after bending.

Optionally, step S903, forming the first conductive layer includes: forming a first connecting electrode 41 and a second connecting electrode 42 as shown in FIG. 13 at the same time.

Step S905, forming the second conductive layer includes: forming a third connecting electrode 81, a fourth connecting electrode 82 and a fifth connecting electrode 83 as shown in FIG. 16 at the same time; wherein the third connecting electrode 81 and the first connecting electrode 41 are electrically connected, the fifth connecting electrode 83 and the second connecting electrode 42 are electrically connected.

Optionally, after step S905, forming the second conductive layer, and before step S906, removing the base plate 1 located in the bending area A2, the method further includes:

step S911, referring to FIG. 6 or FIG. 7, electrically connecting a light-emitting element 13 to the third connecting electrode 81 and the fourth connecting electrode 82; wherein the light-emitting element 13 is located in the device disposing area A1; and step S912, referring to FIG. 6 or FIG. 7, electrically connecting a circuit board 14 to the fifth connecting electrode 83; wherein the circuit board 14 is located in the bonding area A3.

It should be noted that, in the above process, step S912, electrically connecting the circuit board 14 to the fifth connecting electrode 83, may also be performed first; then step S911, electrically connecting the light-emitting element 13 to the third connecting electrode 81 and the fourth connecting electrode 82 may be performed. It is determined according to the actual situation.

The driving substrate provided in the embodiment of the present disclosure forms a part of the control circuit through the first connecting electrode 41, the third connecting electrode 81 and the fourth connecting electrode 82 set in the device disposing area A1, and is used to provide electrical signals to the light-emitting element 13 to control the opening and closing of the light-emitting element 13; and forms a part of the driving circuit through the second connecting electrode 42 and the fifth connecting electrode 83, to be electrically connected with the control circuit, and to provide driving signals to the control circuit.

It should be noted that other structures included in the above-mentioned control circuit and driving circuit may refer to the related art, which may not be repeated here.

Optionally, after step S912, electrically connecting the circuit board 14 to the fifth connecting electrode 83, and before step S906, removing the base plate 1 located in the bending area A2, the method further includes:

forming a protective layer 12 on the light-emitting element 13; wherein the protective layer 12 covers each of the light-emitting elements 13 and areas between two adjacent light-emitting elements 13.

It should be noted that the above-mentioned protective layer 12 may be formed after the light-emitting element 13 and the circuit board 14 are bound and before the base plate 1 located in the bending area A2 is removed; or, may be formed after the base plate 1 located in the bending area A2 is removed and the light-emitting apparatus is bent.

In practical applications, the above-mentioned protective layer 12 may include a first sublayer and a second sublayer, wherein the second sublayer is located on the side of the first sublayer away from the light-emitting element, and the first sublayer is a white glue, and is used to protect the light-emitting element 13; the second sub-layer is a black glue, which is used to prevent the cross-color of the light emitted by each light-emitting element 13.

Alternatively, the above-mentioned protective layer 12 may also include only one sublayer, that is, only include a black glue, the light-emitting element 13 and the area between the two adjacent light-emitting element 13 are covered by the black glue, and simultaneously plays the role of protecting the light-emitting element 13 and preventing the cross-color.

Figure 17:
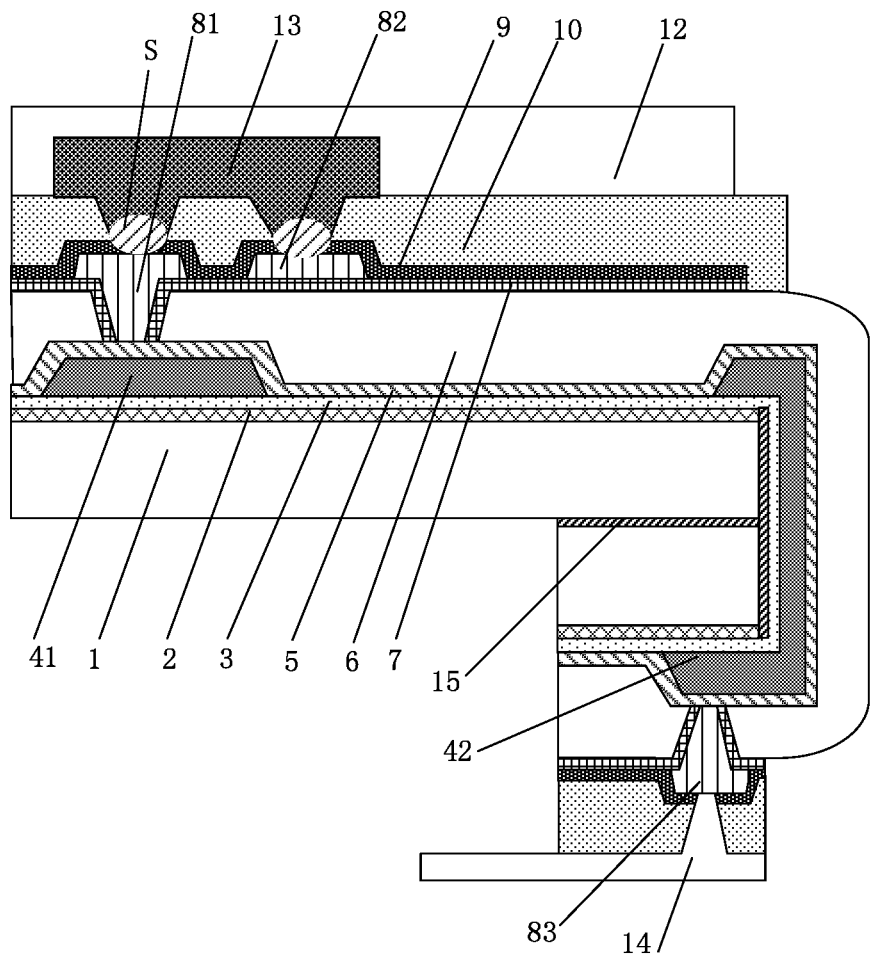

Optionally, after step S906, removing the base plate 1 located in the bending area A2, the method further includes:

referring to FIG. 17, forming adhesive layers 15 on a surface of the base plate 1 located in the bonding area A3 away from the flexible dielectric layer 6, a surface of the base plate 1 located in the device disposing area A1 away from the flexible dielectric layer 6, a surface of the buffer layer 3 located in the bending area A2 away from the flexible dielectric layer 6, and a side of the base plate 1 that is parallel to a direction perpendicular to the flexible dielectric layer 6 and close to the bending area A2; and bending the bending area A2, to make the surface of the base plate 1 located in the bonding area A3 away from the flexible dielectric layer 6 to be fixed with the surface of the base plate 1 located in the device disposing area A1 away from the flexible dielectric layer 6.

It should be noted that, in the manufacturing method provided in the embodiment of the present disclosure, after bending the driving substrate located in the bending area A2 along the OA direction as shown in FIG. 4, the surface of the base plate 1 located in the bonding area A3 away from the flexible dielectric layer 6 and the surface of the base plate 1 located in the device disposing area A1 away from the flexible dielectric layer 6 are fixed together, and then light treatment or heat treatment is performed on the driving substrate to cure the adhesive layers 15.

The following takes the structure of the light-emitting apparatus as shown in FIG. 8 as an example to describe its manufacturing method in detail:

S1, providing a base plate 1;

S2, forming a sacrificial layer 2 on the base plate 1;

S3, forming a buffer layer 3 on the sacrificial layer 2;

S4, forming a first conductive layer 4 on the buffer layer 3; wherein the first conductive layer 4 includes a first connecting electrode 41 and a second connecting electrode 42;

S5, forming a third passivation layer 5 on the first conductive layer 4;

S6, forming a flexible dielectric layer 6 on the third passivation layer 5;

wherein, as shown in FIG. 6, since the flexible dielectric layer 6 is made of polyimide material (PI), the leveling property of the polyimide causes that the thickness L1 of the second connecting electrode 42 is significantly lower than a coating thickness L2, thereby reducing the film thickness of the bending area A2 during subsequent bending, reducing the film strain, and improving the failure problem of the film due to the strain.

S7, forming a first passivation layer 7 on the flexible dielectric layers 6 located in the device disposing area A1 and the bonding area A3;

S8, forming a second conductive layer on the first passivation layer 7; wherein, the second conductive layer includes the third connecting electrode 81, the fourth connecting electrode 82 and the fifth connecting electrode 83;

S9, forming a second passivation layer 9 on the second conductive layer; the second passivation layer 9 covers the second conductive layer, and covers the first passivation layer 7 located in the device disposing area A1 and the bonding area A3;

S10, forming an organic layer s10 on the second passivation layer 9 located in the device disposing area A1 and the bonding area A3;

S11, transferring the light-emitting element 13 to the driving substrate to electrically connect the light-emitting element with the third connecting electrode 81 and the fourth connecting electrode 82; this process is called the bonding of the light-emitting element.

S12, transferring the circuit board 14 to the driving substrate to electrically connect the circuit board 14 with the fifth connecting electrode 83; this process is called the bonding of the circuit board.

S13, forming a protective layer 12 on the light-emitting element 13;

S14, removing the base plate 1 located in the bending area A2;

Since the light-emitting apparatus is provided with the sacrificial layer 2, the base plate 1 may be cut along the junction of the device disposing area A1 and the bending area A2, and the junction of the bonding area A3 and the bending area A2, and then the base plate located in the bending area may be removed by mechanical peeling. At this time, the sacrificial layer 2 and the base plate 1 located in the bending area A2 are removed together. Certainly, it may also be removed by laser lift-off, which is not limited here.

S15, forming adhesive layers 15 on a surface of the base plate 1 located in the bonding area A3 away from the flexible dielectric layer 6, a surface of the base plate 1 located in the device disposing area A1 away from the flexible dielectric layer 6, a surface of the buffer layer 3 located in the bending area A2 away from the flexible dielectric layer 6, and a side of the base plate 1 that is parallel to a direction perpendicular to the flexible dielectric layer 6 and close to the bending area A2;

according to the foregoing description, the light-emitting apparatus of the present disclosure has a small bending margin (R). Therefore, the filling thickness of the above-mentioned adhesive layer 15 is relatively thin, and the process has strong controllability of its thickness, and the uniformity of the filling thickness is greatly improved.

S16, as shown in FIG. 17, bending the bending area A2, to make the surface of the base plate 1 located in the bonding area A3 away from the flexible dielectric layer 6 to be fixed with the surface of the base plate 1 located in the device disposing area A1 away from the flexible dielectric layer 6.

S17, performing a side water-resistant layer 11 deposition by using a 3D sputter equipment; wherein, the material of the water-resistant layer 11 may be SiNx material with a thickness ranging from 2000 A to 4000 A; or, the water-resistant layer 11 includes two sublayers, and the material of the two sublayers are SiNx and organic OC materials, respectively, to further play a protective role. It should be noted that, if the water-resistant layer 11 includes two sublayers, and the materials of the two sub-layers are SiNx and organic OC materials, respectively, the sublayer with the material of SiNx is located between the sublayer with the material of the organic OC material and flexible dielectric layer 6.

Reference herein to "one embodiment," "an embodiment," or "one or more embodiments" means that a particular feature, structure, or characteristic described in connection with an embodiment is included in at least one embodiment of the present disclosure. Also, please note that instances of the phrase "in one embodiment" herein are not necessarily all referring to the same embodiment.

In the description provided herein, numerous specific details are set forth. It may be understood, however, that the embodiments of the present disclosure may be practiced without these specific details. In some instances, well-known methods, structures, and techniques have not been shown in detail in order not to obscure an understanding of this description.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: modifications may still be made to the technical solutions recorded in the foregoing embodiments, or some technical features thereof may be equivalently replaced; and these modifications or replacements do not make the essence of the corresponding technical solutions deviate from the spirit and scope of the technical solutions of the embodiments of the present disclosure.

The invention claimed is:

1. A driving substrate, wherein the driving substrate is divided into a device disposing area, a bending area, and a bonding area; the bending area is located between the device disposing area and the bonding area;
   each of a section of the driving substrates located in the device disposing area, a section of the driving substrate located in the bending area, and a section of the driving substrate located in the bonding area comprises a buffer layer, a first conductive layer and a flexible dielectric layer that are stacked in sequence;
   each of the section of the driving substrates located in the device disposing area and the section of the driving substrate located in the bonding area further comprises a base plate disposed at a side of the buffer layer away from the first conductive layer, and a second conductive layer disposed at a side of the flexible dielectric layer away from the first conductive layer; and
   the section of the driving substrate located in the bending area is configured to be capable to bend along a bending axis;
   wherein the driving substrate further comprises a sacrificial layer and a third passivation layer, the sacrificial layer is located between the base plate and the buffer layer, and the third passivation layer is located between the first conductive layer and the flexible dielectric layer.

2. The driving substrate according to claim 1, wherein the driving substrate further comprises a first passivation layer, the first passivation layer covers the flexible dielectric layer located in the device disposing area and the bonding area.

3. The driving substrate according to claim 1, wherein the driving substrate further comprises a second passivation layer, the second passivation layer covers the second conductive layer, and an orthographic projection of the second passivation layer on the buffer layer does not overlap with an orthographic projection of the flexible dielectric layer located in the bending area on the buffer layer.

4. The driving substrate according to claim 3, wherein the driving substrate further comprises an organic layer, the organic layer covers the second passivation layer, and an orthographic projection of the organic layer on the buffer layer does not overlap with the orthographic projection of the flexible dielectric layer located in the bending area on the buffer layer.

5. The driving substrate according to claim 3, wherein the driving substrate further comprises an organic layer, the organic layer covers the second passivation layer, and covers the flexible dielectric layer located in the bending area.

6. The driving substrate according to claim 1, wherein when the bending area is in a non-bending state, a surface of the base plate located in the device disposing area away from the flexible dielectric layer and a surface of the base plate located in the bonding area away from the flexible dielectric layer are in a same plane; and
   when the bending area is in a bent state, the surface of the base plate located in the bonding area away from the flexible dielectric layer is fixed with the surface of the base plate located in the device disposing area away from the flexible dielectric layer.

7. The driving substrate according to claim 6, wherein when the bending area is in a bent state, an adhesive layer is disposed between the surface of the base plate located in the bonding area away from the flexible dielectric layer and the surface of the base plate located in the device disposing area away from the flexible dielectric layer, and the adhesive layer extends to a surface of the buffer layer located in the bending area away from the flexible dielectric layer.

8. The driving substrate according to claim 1, wherein the first conductive layer comprises a first connecting electrode and a second connecting electrode, an orthographic projection of the first connecting electrode on the buffer layer partially overlaps with an orthographic projection of the second conductive layer located in the device disposing area on the buffer layer; the second connecting electrode is located in the bending area, and two ends of the second connecting electrode extend to the device disposing area and the bonding area, respectively.

9. The driving substrate according to claim 8, wherein the second conductive layer comprises a third connecting electrode, a fourth connecting electrode, and a fifth connecting electrode; the third connecting electrode and the fourth connecting electrode are located in the device disposing area, and the fifth connecting electrode is located in the bonding area;

wherein the third connecting electrode and the first connecting electrode are electrically connected, the fifth connecting electrode and the second connecting electrode are electrically connected.

10. The driving substrate according to claim 9, wherein the flexible dielectric layer is provided with a first via hole and a second via hole in a direction perpendicular to the base plate, the first via hole exposes a partial area of the first connecting electrode, and the second via hole exposes a partial area of an end of the second connecting electrode located in the bonding area;

wherein the third connecting electrode is electrically connected to the first connecting electrode through the first via hole, and the fifth connecting electrode is electrically connected to the second connecting electrode through the second via hole.

11. A light-emitting apparatus, wherein the apparatus comprises: a light-emitting element, a circuit board, and the driving substrate according to claim 9, the light-emitting element is electrically connected to the third connecting electrode and the fourth connecting electrode located in the device disposing area, and the circuit board is electrically connected to the fifth connecting electrode located in the bonding area.

12. The light-emitting apparatus according to claim 11, wherein the light-emitting apparatus further comprises a protective layer disposed at a side of the light-emitting element away from the base plate, and the protective layer covers each of the light-emitting elements and areas between two adjacent light-emitting elements.

13. A splicing display apparatus, comprising a multiport transponder, at least one power supply equipment, a first frame, a second frame and at least two light-emitting apparatuses according to claim 11;

wherein light-emitting surfaces of the at least two light-emitting apparatuses are all in a same plane, and each of the light-emitting apparatuses is fixed with the first frame, the first frame is fixed with the second frame, the second frame is located at a side of the first frame away from the light-emitting apparatus, and the multiport transponder and the at least one power supply equipment are fixed with the second frame;

wherein the multiport transponder and the power supply equipment are electrically connected, the circuit board of each of the light-emitting apparatuses and the multiport transponder are electrically connected.

14. A manufacturing method of a light-emitting apparatus, wherein the method comprises:

providing a base plate; wherein the base plate is divided into a device disposing area, a bending area and a bonding area, and the bending area is located between the device disposing area and the bonding area;

forming a buffer layer;

forming a first conductive layer; wherein the buffer layer is located between the base plate and the first conductive layer;

forming a flexible dielectric layer; wherein the flexible dielectric layer is located at a side of the first conductive layer away from the base plate;

forming a second conductive layer; wherein the second conductive layer is located at a side of the flexible dielectric layer away from the base plate, and an orthographic projection area of the second conductive layer on the base plate does not overlap with an orthographic projection of the flexible dielectric layer located in the bending area on the base plate; and removing the base plate located in the bending area-;

wherein the driving substrate further comprises a sacrificial layer and a third passivation layer, the sacrificial layer is located between the base plate and the buffer layer, and the third passivation layer is located between the first conductive layer and the flexible dielectric layer.

15. The manufacturing method according to claim 14, wherein after forming the flexible dielectric layer and before forming the second conductive layer, the method further comprises:

forming a first passivation layer on a section of the flexible dielectric layers located in the device disposing area and a section of the flexible dielectric layer located in the bonding area.

16. The manufacturing method according to claim 14, wherein after forming the second conductive layer and before removing the base plate located in the bending area, the method further comprises:

forming a second passivation layer on the second conductive layer; wherein the second passivation layer covers the second conductive layer, and an orthographic projection of the second passivation layer on the buffer layer does not overlap with an orthographic projection of the section of the flexible dielectric layer located in the bending area on the buffer layer; and forming an organic layer on the second passivation layer; and the organic layer at least covers the second passivation layer.

17. The manufacturing method according to claim 16, wherein forming the organic layer on the second passivation layer, and the organic layer at least covers the second passivation layer comprises:

forming an organic thin-film on the second passivation layer;

patterning the organic thin-film, to obtain the organic layer;

wherein the organic layer covers the second passivation layer, and an orthographic projection of the organic layer on the buffer layer does not overlap with the orthographic projection of the section of the flexible dielectric layer located in the bending area on the buffer layer; or, the organic layer covers the second passivation layer, and covers the section of the flexible dielectric layer located in the bending area.

18. The manufacturing method according to claim 14, wherein, forming the first conductive layer comprises:

forming a first connecting electrode and a second connecting electrode at the same time;

forming the second conductive layer comprises:

forming a third connecting electrode, a fourth connecting electrode and a fifth connecting electrode at the same time; wherein the third connecting electrode and the first connecting electrode are electrically connected, the fifth connecting electrode and the second connecting electrode are electrically connected.

19. The manufacturing method according to claim 14, wherein after removing the base plate located in the bending area, the method further comprises:

forming adhesive layers on a surface of the base plate located in the bonding area away from the flexible dielectric layer, a surface of the base plate located in the device disposing area away from the flexible dielectric layer, a surface of the buffer layer located in the bending area away from the flexible dielectric layer, and a side of the base plate that is parallel to a direction perpendicular to the flexible dielectric layer and close to the bending area; and bending the bending area, to make the surface of the base plate located in the bonding area away from the flexible dielectric layer to be fixed with the surface of the base plate located in the device disposing area away from the flexible dielectric layer.

* * * * *